United States Patent
Reinle et al.

(10) Patent No.: US 10,133,420 B2
(45) Date of Patent: Nov. 20, 2018

(54) CAPACITIVE SENSOR ARRANGEMENT AND TOUCH-SENSITIVE SCREEN HAVING A CAPACITIVE SENSOR ARRANGEMENT

(71) Applicant: Johnson Controls Automotive Electronics GmbH, Remchingen (DE)

(72) Inventors: Thomas Reinle, Unterhaching (DE); Manfred Süss, Remchingen (DE)

(73) Assignee: Visteon Global Technologies, Inc., Van Buren Township, MI (US)

( * ) Notice: Subject to any disclaimer, the term of this patent is extended or adjusted under 35 U.S.C. 154(b) by 0 days.

(21) Appl. No.: 14/406,463

(22) PCT Filed: Apr. 17, 2013

(86) PCT No.: PCT/EP2013/057980
§ 371 (c)(1),
(2) Date: Dec. 8, 2014

(87) PCT Pub. No.: WO2013/182342
PCT Pub. Date: Dec. 12, 2013

(65) Prior Publication Data
US 2015/0185908 A1    Jul. 2, 2015

(30) Foreign Application Priority Data
Jun. 9, 2012 (DE) .................. 10 2012 011 626

(51) Int. Cl.
*G06F 3/044* (2006.01)
*H05K 1/02* (2006.01)
(Continued)

(52) U.S. Cl.
CPC ............ *G06F 3/044* (2013.01); *H01G 4/232* (2013.01); *H01G 4/30* (2013.01); *H05K 1/0298* (2013.01); *H05K 2203/06* (2013.01)

(58) Field of Classification Search
CPC ...... G06F 3/041; G06F 3/0412; G06F 3/0414; G06F 3/0421; G06F 3/044; G06F 3/045;
(Continued)

(56) References Cited

U.S. PATENT DOCUMENTS 5,745,335 A * 4/1998 Watt .................. H01G 4/232
257/E21.011
6,737,179 B2 * 5/2004 Sengupta .............. H01P 1/181
428/699

(Continued)

FOREIGN PATENT DOCUMENTS

CN       1744023 A       3/2006
CN     201590062 U       9/2010
(Continued)

OTHER PUBLICATIONS

International Search Report in PCT/EP2013/057980 and English translation, 7 pages.
(Continued)

*Primary Examiner* — Sanjiv D Patel
(74) *Attorney, Agent, or Firm* — Quinn IP Law

(57) ABSTRACT

A capacitive sensor arrangement has at least one capacitive sensor and a coating applied to a front side of the at least one capacitive sensor. The coating includes a multiple layer structure, which is formed from capacitive layers, which are arranged in plies and electrically connected in series. A touch-sensitive screen can include at least one such capacitive sensor.

10 Claims, 2 Drawing Sheets

Figure 1:
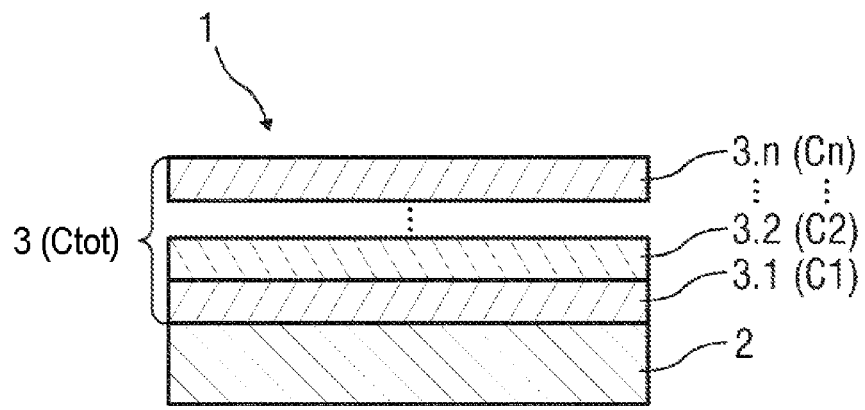

(51) Int. Cl.
*H01G 4/232* (2006.01)
*H01G 4/30* (2006.01)

(58) Field of Classification Search
CPC .............. G06F 3/0488; G02F 1/13338; H05K 2201/0187; H05K 3/4644; H05K 1/11; H01G 4/30; H01G 4/232; H01G 4/38; H01G 5/38
See application file for complete search history.

(56) References Cited

U.S. PATENT DOCUMENTS

| | | | |
|---|---|---|---|
| 2003/0142461 A1* | 7/2003 | Decker | H01G 4/30 361/306.3 |
| 2007/0242055 A1 | 10/2007 | Lai | |
| 2007/0248799 A1* | 10/2007 | DeAngelis | G01L 1/146 428/209 |
| 2009/0085890 A1 | 4/2009 | Saito et al. | |
| 2009/0154055 A1* | 6/2009 | Takashima | H01G 4/228 361/301.4 |
| 2010/0120473 A1* | 5/2010 | Oh | G06F 3/044 455/566 |
| 2010/0238602 A1* | 9/2010 | Capanu | H01G 7/06 361/277 |
| 2010/0265193 A1 | 10/2010 | Kung et al. | |
| 2011/0100727 A1 | 5/2011 | Choi et al. | |
| 2011/0310459 A1* | 12/2011 | Gates | G06F 3/0412 359/296 |
| 2013/0134996 A1* | 5/2013 | Burberry | G06F 3/044 324/679 |
| 2013/0135548 A1* | 5/2013 | Burberry | G06F 3/044 349/38 |

FOREIGN PATENT DOCUMENTS

| | | |
|---|---|---|
| EP | 1 811 364 A2 | 7/2007 |
| EP | 2 187 295 A2 | 5/2010 |
| EP | 2 317 420 A1 | 5/2011 |
| JP | 2010-086236 A | 4/2010 |
| JP | 2011-129165 A | 6/2011 |
| JP | 2012-251030 A | 12/2012 |
| JP | 2015-515431 A | 7/2015 |
| WO | WO 98/00871 A1 | 1/1998 |

OTHER PUBLICATIONS

Office Action in corresponding Japanese Application No. 2015-515431 dated Mar. 8, 2016, and English translation, 6 pages.
Office Action dated Apr. 21, 2017, received in corresponding Chinese application No. 201380041062.0, (8 pages) and English translation (8 pages).
Office Action dated Aug. 30, 2016, received in corresponding Chinese Application No. 201380041062.0, (7 pages) and English translation (5 pages).
Office Action dated Aug. 1, 2017, in corresponding Japanese application No. 2017-000553 (2 pages) and English translation (1 page).
Office Action dated Aug. 30, 2017, received in corresponding Chinese application No. 201380041062.0 (5 pages) and English translation (4 pages).
Examination Report dated Jul. 2, 2018, in corresponding European application No. 13 719 047.6 (5 pages) and English translation (4 pages).

* cited by examiner

CAPACITIVE SENSOR ARRANGEMENT AND TOUCH-SENSITIVE SCREEN HAVING A CAPACITIVE SENSOR ARRANGEMENT

CROSS REFERENCE TO RELATED APPLICATIONS

The present application is a U.S. National Stage of International Application No. PCT/EP2013/057980 filed on Apr. 17, 2013, which claims the benefit of German Patent Application No. 10 2012 011 626.8 filed on Jun. 9, 2012, the entire disclosures of all of which are incorporated herein by reference.

The invention relates to a capacitive sensor arrangement having at least one capacitive sensor and a coating applied to a front side of the at least one capacitive sensor.

The invention furthermore relates to a touch-sensitive screen having at least one such capacitive sensor arrangement.

Touch-sensitive screens by means of which a program execution on a technical device is controllable by touching the screen are generally known from the prior art. In this regard, the touch-sensitive screens each comprise a display unit for displaying an image and a capacitive sensor arrangement for sensing touches by an operator. The sensor arrangement is designed in such a way that, when said sensor arrangement is touched at preset positions, specific functions represented alphanumerically and symbolically at the same positions on the image are performed.

EP 1 811 364 A2 discloses a display device comprising a touch-sensitive surface, which display device comprises a layer system for determining the position of an object, for example a finger, touching or coming close to touching the surface of the display device. In this case, the layer system is designed in such a way that a capacitive and resistive evaluation capacity is possible. For this purpose, the layer system comprises a capacitive layer arrangement and a resistive layer arrangement, wherein the capacitive layer arrangement comprises a conductive layer used as capacitor electrodes and a flexible insulator layer arranged on a front side of this layer.

The object of the present invention consists in specifying a capacitive sensor arrangement which is improved in comparison with the prior art and a touch-sensitive screen having such a capacitive sensor arrangement.

In respect of the capacitive sensor arrangement, the object is achieved according to the invention by the features specified in claim 1 and in respect of the touch-sensitive screen by the features specified in claim 10.

The capacitive sensor arrangement comprises at least one capacitive sensor and a coating applied to a front side of the at least one capacitive sensor. According to the invention, the coating comprises a multi-level layer structure, which is formed from a plurality of capacitive layers which are connected electrically in series and are arranged in levels.

Owing to this multi-level layer structure having a plurality of capacitive layers connected electrically in series, a reduced total capacitance of the coating is achieved in comparison with a single-level coating formed from a single capacitive layer. Therefore, a so-called interference capacitance generated by the coating is reduced significantly. This results in a particularly advantageous manner in a significant increase in a difference in a useful signal of the capacitive sensor between the untouched sensor and the touched sensor in comparison with the single-level coating being achieved. Therefore, the touched state and the untouched state can safely be distinguished from one another, with the result that, owing to robust and at the same time reproducible measurements, a robust and secure evaluation which is less susceptible to faults can be realized. Furthermore, it is now possible for materials with a greater thickness and/or materials with specific properties to have the capacity to be arranged between the capacitive sensor and an operator surface.

In accordance with one configuration of the capacitive sensor arrangement, the capacitive layers are applied directly to the front side of the capacitive sensor or to a backing layer arranged on the front side of the capacitive sensor. This arrangement is easily producible.

In accordance with a further configuration, the capacitive layers each have the same individual electrical capacitance. Therefore, a total capacitance of the capacitive layers is predeterminable particularly easily. In further configurations, the capacitive layers can also have different individual capacitances.

In one development, the capacitive layers are formed from plastic and/or metal and are therefore characterized by a high degree of robustness.

In accordance with one configuration, conductive layers and/or critical layers are separated by insulating layers so as to prevent diffusion or for other reasons. Therefore, all types of layers and a level and layer structure with a freely selectable order can be used, with the result that the reduced total capacitance is achieved in comparison with a single-level coating with a higher interference capacitance. Conductive layers are in this case understood to mean very thin metal layers or optically transparent metal layers. Said layers have a low resistance and are electrically conductive.

Owing to diffusion, there is the risk of the conductive layers changing. This diffusion is avoided by the insulating layers.

Critical layers are understood to mean, for example, unstable layers which oxidize in the presence of air. If these layers are coated with the insulating layers, stable and constant properties can be realized, and aging and changing of the critical layers can be minimized as a function of time, in particular when using two insulating layers.

In one possible configuration, the capacitive layers are transparent, with the result that the capacitive sensor arrangement is suitable for use in a touch-sensitive screen.

In addition, the capacitive layers are formed in particular as layers of paint, which are layers applied in a printing method, for example. As a result, the capacitive layers are producible with a particularly small thickness and in a very simple manner with little complexity.

In accordance with one possible development, in each case one electrically insulating layer is arranged between the capacitive layers in order to electrically insulate the capacitive layers from one another and therefore to minimize the individual capacitances of the layers and ensure this long term.

The touch-sensitive screen according to the invention comprises at least one capacitive sensor arrangement according to the invention.

Owing to the multi-level layer structure of the coating of the capacitive sensor arrangement and the reduced interference capacitance resulting therefrom, touches with a finger or input aid are capable of being sensed reliably, with the result that robust control, which is insusceptible to faults, of a program execution of a technical device coupled to the touch-sensitive screen can be realized. The input aid may be an electrically conductive stylus or another specific tool, for example a prosthesis suitable for such an operation.

In an advantageous configuration, the capacitive sensor arrangement is arranged on a front side or a rear side of a display unit. In this case, the capacitive sensor arrangement is designed in particular in such a way that, when the sensor arrangement is touched at preset positions, specific functions represented alphanumerically and symbolically at the same positions on an image output by means of the display unit are performed. In this case, the multi-level layer structure in front of the display unit and a control panel realized thereby makes it possible to realize a so-called black panel effect, with the result that optimum contrast results in the case of at the same time minimal reflections on a user interface can be produced. Therefore, reflection-reducing layers and any desired optical effects are producible. In contrast, these advantages cannot be realized with a single-layer structure with a minimized interference capacitance, or only with a very considerable amount of complexity being involved.

Figure 2:
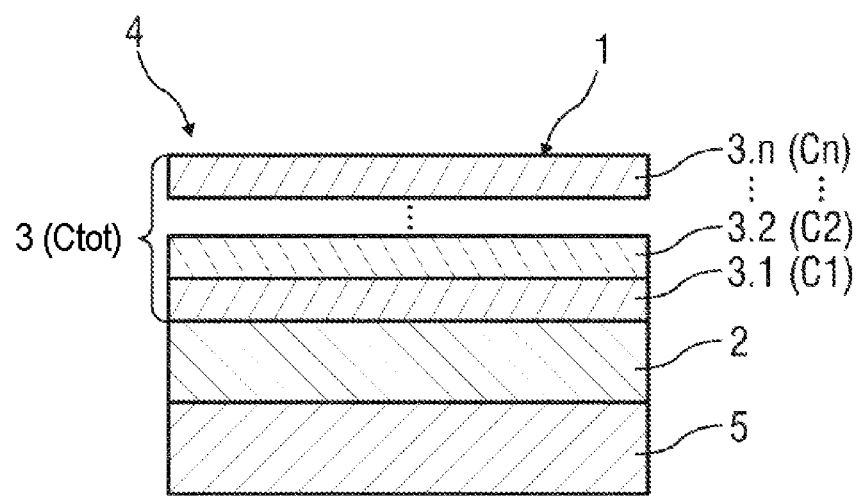
Figure 3:
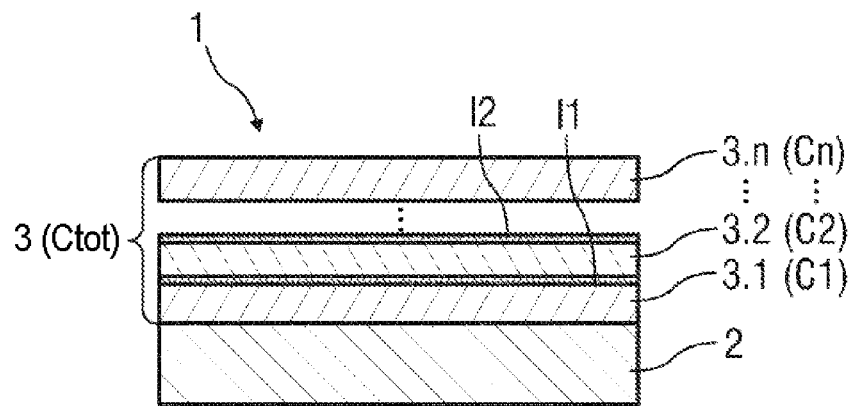
Figure 4:
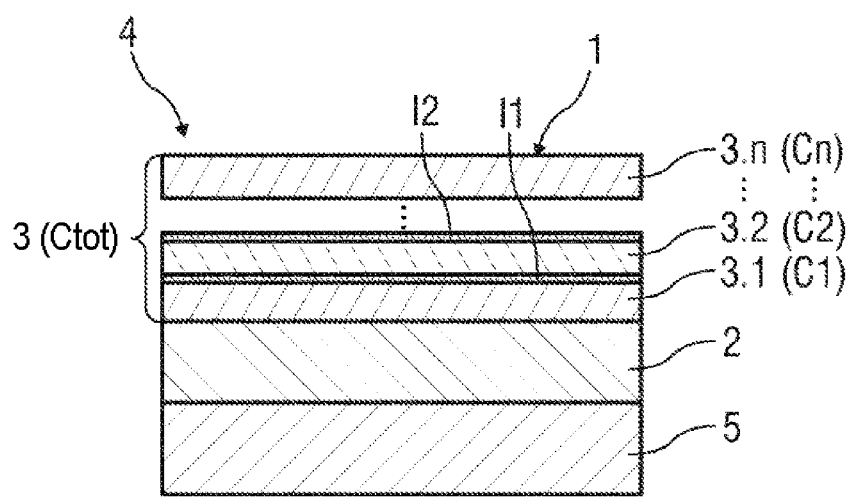

Exemplary embodiments of the invention will be explained in more detail with reference to drawings, in which:

FIG. 1 shows, schematically, a sectional illustration of a first exemplary embodiment of a capacitive sensor arrangement according to the invention, FIG. 2 shows, schematically, a sectional illustration of a first exemplary embodiment of a touch-sensitive screen according to the invention, comprising a capacitive sensor arrangement as shown in FIG. 1, FIG. 3 shows, schematically, a sectional illustration of a second exemplary embodiment of a capacitive sensor arrangement according to the invention, and FIG. 4 shows a sectional illustration of a second exemplary embodiment of a touch-sensitive screen according to the invention, comprising a capacitive sensor arrangement as shown in FIG. 3.

Mutually corresponding parts are provided with the same reference symbols in all figures.

FIG. 1 shows a sectional illustration of a first exemplary embodiment of a capacitive sensor arrangement 1 according to the invention, which comprises a capacitive sensor 2. The capacitive sensor 2 may be any type of capacitive sensor 2, in particular a capacitive sensor 2 which changes its electrical capacitance when touched by a finger or an input aid. This change in capacitance between a touched and an untouched state of the sensor 2 is used to control a program execution on a technical device (not shown) which is coupled to the capacitive sensor 2.

The capacitive sensor 2 is provided on a front side with a multi-level coating 3, which is formed from a plurality of capacitive layers 3.1 to 3.$n$. The capacitive layers 3.1 to 3.$n$ each have a capacitive coupling with respect to one another and are arranged one above the other in a plurality of levels, with the result that a series circuit of capacitors is provided. The layers 3.1 to 3.$n$ may be layers of any type which are formed from plastic and/or metal and are transparent, in a possible configuration.

In a possible embodiment, the layers 3.1 to 3.$n$ are electrically conductive and are connected electrically in series with one another. Therefore, the layers 3.1 to 3.$n$ in this embodiment also each have a capacitive coupling with respect to one another and form, arranged in a plurality of levels one above the other, a series circuit of capacitors.

In a possible embodiment, the layers 3.1 to 3.$n$ are layers of paint. The layers 3.1 to 3.$n$ are applied directly to the capacitive sensor 2, for example, in a printing method and, in an embodiment not shown, to a backing plate arranged on the front side of the capacitive sensor 2.

In an alternative exemplary embodiment (illustrated in more detail in FIG. 3), in addition in each case electrically insulating layers I1, I2 are arranged between the layers 3.1 to 3.$n$.

Owing to the electrical series circuit of capacitive layers 3.1 to 3.$n$, an effective total capacitance Ctot is reduced in comparison with a single-layer or single-level structure of the coating 3 in accordance with the following equation, wherein a reciprocal of the total capacitance Ctot results from the sum of the reciprocals of individual capacitances C1 to Cn of the capacitive layers 3.1 to 3.$n$:

$$\frac{1}{Ctot} = \frac{1}{C1} + \frac{1}{C2} + \ldots + \frac{1}{Cn}. \quad (1)$$

Therefore, the resultant total capacitance is less than the highest individual capacitance C1 to Cn of one of the capacitive layers 3.1 to 3.$n$.

If the coating 3 is formed from two capacitive layers 3.1, 3.2, for example, which each have the same individual capacitance C1, C2, the resultant total capacitance Ctot is only half one of the individual capacitances C1, C2. This total capacitance Ctot acts as interference capacitance on the capacitive sensor 2. Owing to the reduction in the interference capacitance in comparison with a single-level coating 3 by half, a larger measurement signal can be sensed by the sensor 2 when the capacitive sensor 2 is touched. This larger measurement signal results from a greater signal change with a higher resolution between the touched and untouched state of the sensor 2 and therefore results in the sensor arrangement 1 being less susceptible to faults.

If the coating 3 is formed from three capacitive layers 3.1, 3.2, 3.3, which each have the same individual capacitance C1, C2, C3, the resultant total capacitance Ctot is now only a third of one of the individual capacitances C1, C2, C3. Owing to the reduction in the interference capacitance thus achieved in comparison with a single-level coating 3 by two thirds, a further improved measurement signal can be sensed by the sensor 2 with a greater signal change and a higher resolution when the capacitive sensor 2 is touched, and therefore the susceptibility of the sensor arrangement 1 to faults is further reduced.

If the coating 3 is formed from four capacitive layers 3.1 to 3.4, which each have the same individual capacitance C1 to C4, the resultant total capacitance Ctot is then now only a quarter of one of the individual capacitances C1 to C4. Owing to the reduction in the interference capacitance thus achieved in comparison with a single-level coating 3 by three quarters, a measurement signal which is further improved in comparison with the embodiment with three layers 3.1 to 3.3 with a greater signal change and a higher resolution can be sensed by the sensor 2 when the capacitive sensor 2 is touched, and therefore the susceptibility of the sensor arrangement 1 to faults is further reduced.

As a further advantage, the multi-level design of the coating 3 with a plurality of capacitive layers 3.1 to 3.$n$ means that color coverage and color saturation are improved in comparison with the embodiment with a single-level or single-layer formation of the coating 3. In the case of such a single-level or single-layer formation of the coating 3 with a comparatively high color coverage and color saturation, the effective total capacitance Ctot would be so high that sensing of the capacitive sensor 2 being touched would now only be insufficient or would even no longer be possible at all since the change in a useful signal of the capacitive sensor 2 between the untouched state and the touched state is very small and therefore can only be sensed with difficulties. Therefore, a reproducible measurement and evaluation would no longer be possible.

The ideal total capacitance Ctot of the coating 3 is zero, with the result that an increase in the number of capacitive layers 3.1 to 3.$n$ results in a continuous increase in the change in the useful signal of the capacitive sensor 2 between the untouched state and the touched state, i.e. a change in the signal between these states, in a continuous increase in the resolution and in a continuous reduction in the susceptibility of the sensor arrangement 1 to faults.

FIG. 2 shows a sectional illustration of a first exemplary embodiment of a touch-sensitive screen 4 according to the invention. The screen 4 comprises a display unit 5, which is in the form of an LCD display, for example. Alternatively, other types of display units 5 can also be provided.

The capacitive sensor arrangement 1 shown in FIG. 1 is arranged on a front side of the display unit 5. The sensor arrangement 1, i.e. the capacitive sensor 2 and its coating 3 are transparent, with the result that in particular alphanumerically and/or symbolically represented information are detectable by a user by means of the display unit 5. In an alternative configuration (not shown), the capacitive sensor arrangement 1 is arranged on a rear side of the display unit 5.

Control commands which are stored in a control unit (not illustrated in any more detail) which is connected to the screen 4 are assigned to the represented information. When the sensor arrangement 1 is touched, the capacitance of the capacitive sensor 2 changes, wherein a position of the touch on the sensor arrangement 1 can be determined from the magnitude of the change. The position which the operator has selected on the image represented by means of the display unit 5 is derived from the determined position and a control command assigned to the information represented at this position is implemented. By means of the control command, the program execution of the technical device (not shown) which is coupled to the screen 4 is controlled.

FIG. 3 shows a sectional illustration of a second exemplary embodiment of the capacitive sensor arrangement 1 according to the invention, wherein, in addition, in each case electrically insulating layers I1, I2 are arranged between the layers 3.1 to 3.n. These electrically insulating layers I1, I2 enable long-term minimization of the individual capacitances C1 to Cn.

FIG. 4 shows a sectional illustration of a second exemplary embodiment of the touch-sensitive screen 4 according to the invention. In this case, the capacitive sensor arrangement 1 shown in FIG. 3 is arranged on a front side of the display unit 5.

LIST OF REFERENCE SYMBOLS 1 sensor arrangement
2 sensor
3 coating
3.1 to 3.n layer
4 screen
5 display unit
C1 to Cn individual capacitance
Ctot total capacitance
I1, I2 layer

The invention claimed is:
1. A touch-sensitive screen comprising:
a display;
at least one capacitive sensor arranged on a front side of the display; and
a coating applied to a front side of the at least one capacitive sensor opposite a back side of the at least one capacitive sensor proximal to the front side of the display,
wherein the coating comprises a flat multi-level layer structure, which is formed from a plurality of capacitive layers which are connected electrically in series and are arranged in levels, whereby the capacitive layers:
each have an individual electrical capacitance,
are electrically conductive,
each have a capacitive coupling, are arranged one above the other in a plurality of levels, with the result that an electric series connection of capacitors is provided; and
wherein a resultant total capacitance of the capacitances of all capacitive layers is reduced; and
wherein at least one diffusion avoiding layer is applied between the capacitive layers.

2. The touch-sensitive screen as claimed in claim 1, wherein the capacitive layers are applied directly to the front side of the capacitive sensor or to a backing layer arranged on the front side of the capacitive sensor.

3. The touch-sensitive screen as claimed in claim 1, wherein the capacitive layers are formed from plastic and/or metal.

4. The touch-sensitive screen as claimed in claim 1, wherein the capacitive layers are transparent.

5. The touch-sensitive screen as claimed in claim 1, wherein the capacitive layers are layers of paint.

6. The touch-sensitive screen as claimed in claim 1, characterized in that wherein the capacitive layers are lasers which are applied in a printing method.

7. The touch-sensitive screen as claimed in claim 1, wherein in each case one electrically insulating layer is arranged between the capacitive layers.

8. The touch-sensitive screen as claimed in claim 1, wherein in each case at least one insulating layer is arranged between conductive layers and/or critical layers.

9. A touch-sensitive screen, comprising:
a display;
at least one capacitive sensor arranged on a front side of the display; and
a coating applied to a front side of the at least one capacitive sensor opposite a back side of the at least one capacitive sensor proximal to the front side of the display, the coating comprising a multi-level layer structure formed from a plurality of capacitive layers, the plurality of capacitive layers connected electrically in series and arranged in levels, wherein the plurality of capacitive layers:
each have an individual electrical capacitance;
are electrically conductive,
each have a capacitive coupling, and
are arranged one above the other in a plurality of levels, with the result that a series circuit of capacitors is provided, wherein a resultant total capacitance of the electrical capacitances of all capacitive layers is reduced.

10. The touch-sensitive screen of claim 9, wherein one electrically insulating layer is arranged between each adjacent pair of the plurality of capacitive layers.

* * * * *